United States Patent
Segev et al.

(10) Patent No.: US 9,323,610 B2
(45) Date of Patent: Apr. 26, 2016

(54) NON-BLOCKING COMMANDS

(71) Applicants: Amir Segev, Meitar (IL); Tal Sharifie, Lehavim (IL); Shay Benisty, Beer Sheva (IL)

(72) Inventors: Amir Segev, Meitar (IL); Tal Sharifie, Lehavim (IL); Shay Benisty, Beer Sheva (IL)

(73) Assignee: SanDisk Technologies Inc., Plano, TX (US)

( * ) Notice: Subject to any disclaimer, the term of this patent is extended or adjusted under 35 U.S.C. 154(b) by 163 days.

(21) Appl. No.: 14/168,697

(22) Filed: Jan. 30, 2014

(65) Prior Publication Data
US 2015/0212878 A1  Jul. 30, 2015

(51) Int. Cl.
*G06F 11/10* (2006.01)
*G06F 3/06* (2006.01)
*G11C 29/52* (2006.01)

(52) U.S. Cl.
CPC ............ *G06F 11/1048* (2013.01); *G06F 3/068* (2013.01); *G06F 3/0619* (2013.01); *G06F 3/0659* (2013.01); *G06F 11/10* (2013.01); *G06F 11/1016* (2013.01); *G06F 11/1072* (2013.01); *G11C 29/52* (2013.01)

(58) Field of Classification Search
CPC ..... G06F 11/1048; G06F 11/10; G06F 3/068; G06F 3/0659; G06F 11/1016; G06F 3/0619; G06F 11/1072; G11C 29/52
USPC ....................................................... 714/764
See application file for complete search history.

(56) References Cited

U.S. PATENT DOCUMENTS

| 6,317,805 B1* | 11/2001 | Chilton | G06F 3/0619 710/104 |
|---|---|---|---|
| 7,571,373 B1* | 8/2009 | Danilak | G11B 20/1833 714/749 |
| 8,427,771 B1 | 4/2013 | Tsai | |
| 9,047,922 B2* | 6/2015 | Higley | G06F 11/0727 |
| 2012/0079076 A1 | 3/2012 | Chincisan | |
| 2013/0061111 A1 | 3/2013 | Sarcone et al. | |

FOREIGN PATENT DOCUMENTS

| EP | 0430291 A2 | 11/1990 |
|---|---|---|
| EP | 1 286 359 A2 | 2/2003 |

(Continued)

OTHER PUBLICATIONS

Peter, J.-L., "Design of a custom processing unit based on Intel i486 architectures and performances trade-offs," in Computer Design: VLSI in Computers and Processors, 1990. ICCD '90. Proceedings, 1990 IEEE International Conference on , vol., no., pp. 467-470, Sep. 17-19, 1990.*

(Continued)

*Primary Examiner* — Cynthia Britt
(74) *Attorney, Agent, or Firm* — Brinks Gilson & Lione

(57) ABSTRACT

Methods, systems, and devices are provided that processes storage commands. Data may be read from a storage memory at a storage device based on a read command received at the storage device from a host. An error may be detected in the data read from the storage memory at the storage device. In response to the error, placeholder data may be transmitted from the storage device to the host without transmitting an indication that the read command failed or succeeded. Corrected data may be transmitted from the storage device to the host, where the host replaces the placeholder data with the corrected data.

20 Claims, 3 Drawing Sheets

(56) References Cited

FOREIGN PATENT DOCUMENTS

| | | | |
|---|---|---|---|
| EP | 1845682 | A1 | 10/2007 |
| WO | WO 2010/129305 | A1 | 11/2010 |

OTHER PUBLICATIONS

Jafri, S.A.R.; Thottethodi, M.; Vijaykumar, T.N., "LiteTM: Reducing transactional state overhead," in High Performance Computer Architecture (HPCA), 2010 IEEE 16th International Symposium on, vol., No., pp. 1-12, Jan. 9-14, 2010.*

"PCI Express® Base Specification Revision 2.1," dated Mar. 4, 2009, pp. 146-148, PCI Express®, available for download at www.pcisig.com.

"Serial ATA Specification Rev. 3.1 Gold," dated Jul. 18, 2011, pp. 623-627, KnowledgeTek, available for download at 222.sata-io.org.

International Search Report, dated May 7, 2015, pp. 1-9, International Patent Application No. PCT/US2015/012448, European Patent Office, Rijswijk, The Netherlands.

* cited by examiner

NON-BLOCKING COMMANDS

BACKGROUND

1. Technical Field

This application relates to storage systems and, in particular, to storage commands.

2. Related Art

A host may transmit storage commands to a storage device to read data from the storage device, write data to the storage device, and/or to perform administrative operations on the storage device. The host may be a computer, a laptop computer, a desktop computer, a blade server, a mobile device, a tablet, a cell phone, a smart device, a personal digital assistant, or any other processing device.

The storage device may perform the storage commands. When performing a read command, for example, the storage device may transmit data from the storage device to the host. In some examples, the storage commands may conform to a storage protocol, such as a Non Volatile Memory Express (NVMe) standard. The NVMe standard describes a register interface, a command set, and feature set for PCI Express (PCIE®)-based Solid-State Drives (SSDs). PCIE is a registered trademark of PCI-SIG Corporation of Portland, Oreg.

SUMMARY

A method may be provided that processes storage commands. A read command may be received at a storage device from a host. The read command may include a request for data identified by an identifier. Data may be read from storage memory at the storage device based on the identifier. An error may be detected in the data read from the storage memory at the storage device. Placeholder data may be transmitted from the storage device to the host without transmitting an indication that the read command failed or succeeded, and the placeholder data may be indicated to the host to be the data identified by the identifier. Corrected data may be generated that does not include the error detected in the data read from the storage memory. The corrected data may be transmitted from the storage device to the host, where the corrected data replaces the placeholder data in the host as the data identified by the identifier.

A system may be provided that processes storage commands. The system may include a storage memory, a read module, an error detection module, a communication module, and an error correction module. The storage memory may include data identified by an identifier, where a read command received from a host requests the data. The read module may read the data from the storage memory. The error detection module may detect an error in the data read from the storage memory. The communication module may transmit placeholder data to the host without an indication that the read command failed or succeeded, where the placeholder data is represented to the host as the data identified by the identifier. The error correction module may correct the error in the data read from the storage memory. The communication module may transmit the corrected data to the host, where the corrected data is represented to the host as the data identified by the identifier. The read command may complete upon transmission of the corrected data to the host.

A storage device may be provided that processes storage commands. The storage device may include a storage memory, an error detection module, a communication module, and an error correction module. The storage memory may include data. A read command received from a host may request the data. The error detection module may detect an error in the data after the data is read from the storage memory. The communication module may transmit placeholder data to the host without transmission of an indication that the read command failed or succeeded, where the placeholder data is represented as the data requested by the read command. The error correction module may generate corrected data. The communication module may transmit the corrected data to the host, where the corrected data is represented as the data requested by the read command. The corrected data and the placeholder data may be transmitted in fulfillment of the read command.

BRIEF DESCRIPTION OF THE DRAWINGS

The embodiments may be better understood with reference to the following drawings and description. The components in the figures are not necessarily to scale. Moreover, in the figures, like-referenced numerals designate corresponding parts throughout the different views.

DETAILED DESCRIPTION

In one example, a storage device may be provided that processes storage commands in a manner that may reduce blocking of the execution of the storage commands. The storage device may include a storage memory, such as flash memory. In addition, the storage device may include an error detection module, a communication module, and an error correction module.

The storage memory may include data. A read command received from a host may request the data. For example, the read command may include a request for a logical data block that includes the data in the storage memory. The error detection module in the storage device may detect an error in the data after the data is read from the storage memory. For example, the error detection module may include error correction code (ECC) logic that identifies an error in the data read from the storage memory.

In response to detection of the error, the communication module of the storage device may transmit placeholder data to the host without transmission of an indication that the read command failed or succeeded, where the placeholder data is represented as the data requested by the read command. For example, the read command may include a request for a page of data identified by an offset value, and the placeholder data may be represented as the page of data identified by the offset value. The placeholder data may be any data. For example, the place holder data may be the data read from the storage memory that includes the error. The error correction module of the storage device may generate corrected data. The communication module may transmit the corrected data to the host, where the corrected data is represented as the data requested by the read command. The host may replace the placeholder data with the corrected data in a host buffer. The storage device may transmit an indication that the read command completed successfully when the corrected data is transmitted to the host.

Figure 1:
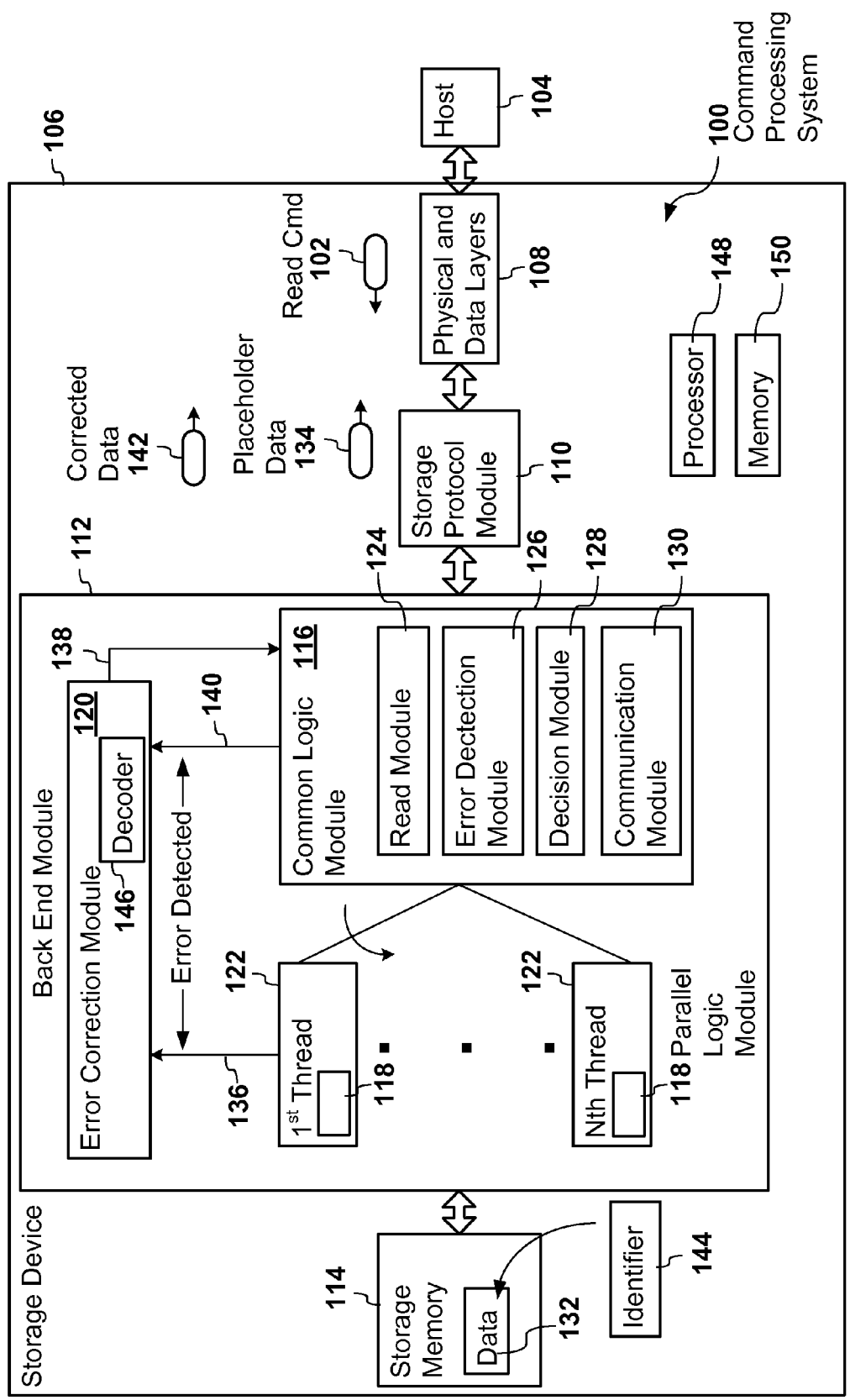
FIG. 1 illustrates a system to process storage commands.

FIG. 1 illustrates a system 100 to process storage commands, such as a read command 102. The system 100 may include a host 104 and a storage device 106. The system 100 may include more, fewer, or different components. For example, the system 100 may include only the storage device 106 or a portion of the storage device 106.

The host 104 may be any device that performs logic operations. For example, the host 104 may be a computer, a laptop computer, a desktop computer, a blade server, a mobile device, a tablet, a cell phone, a smart phone, a personal digital assistant, or any other computing device.

The storage device 106 may be a device that stores and/or retrieves data in response to storage commands. The storage device 106 may be a block storage device. Examples of the storage device 106 may include a hard disk, a flash memory drive, a solid state drive, a Universal Serial Bus (USB) drive, a floppy disk, and a CD-ROM drive. In some examples, the storage device 106 may be any type of device that provides block level assess to storage, such as a scanner or a camera. The storage device 106 may be internal or external to the host 104. The storage device 106 may include a physical and data layers module 108, a storage protocol module 110, a back end module 112, and a storage memory 114.

A storage command, such as the read command 102, may be any data structure that indicates or describes an action that the storage device 106 is to perform and/or has performed. The storage command may be a command in a command set described by the NVMe standard or by any other storage protocol. Examples of the storage command may include Input/Output (I/O) commands and administrative commands. A first example I/O command may include a write command that, when executed, writes one or more logical data blocks to storage. A second example of I/O commands may include the read command 102 that, when executed, reads one or more logical data blocks from storage, or any other command that reads from and/or writes to storage. An administrative command may be any command that performs administrative actions on the storage. Examples of the administrative commands may include an abort command, a namespace configuration command, and/or any other command related to management or control of data storage.

The storage protocol may be any protocol that provides block level access to block devices. Block devices are devices that store and retrieve data in block form. The blocks may be logical data blocks, for example. Examples of the storage protocol may include NVMe, Serial Advanced Technology Attachment (also known as a Serial ATA or SATA), SCSI (Small Computer System Interface), Fibre Channel, INFINIBAND® (INFINIBAND is a registered trademark of System I/O, Inc. of Beaverton, Oreg.), PATA (IDE), or any protocol for communicating data to a storage device.

The read command 102, when executed, may read data in logical data blocks or in units different than logical data blocks. When executed, the read command 102 may read one unit of data, multiple units of data, and/or a set of units of data. The read command 102 may explicitly identify the data to be read. Alternatively, the read command 102 may implicitly identify the data to be read, and the storage device 106 may determine what data to read in response to the read command 102.

The physical and data layers module 108 may be an implementation of a physical network layer and a data layer described in the Open Systems Interconnection (OSI) model (ISO/IEC 7498-1). The physical network layer may be a Media Access Control (MAC) layer, a 10BASE-T layer, an 802.11a/b/g/n PHY layer, or any other physical network layer. The data layer may be a PCIe layer, a Fibre Channel layer, a 802.11a/b/g/n MAC/LLC layer, or any other data layer.

The storage protocol module 110 may be an implementation of all or part of the storage protocol. Examples of the storage protocol module 110 may include an NVMe controller, a SATA controller, a SCSI controller, a Fibre Channel controller, and an INFINIBAND® controller. The storage protocol may correspond in some examples to the transport layer and/or network layer in the OSI model.

The storage memory 114 may be any computer readable memory in which host data is stored. Examples of the storage memory 114 may include flash memory, two-dimensional flash memory, three-dimensional flash memory, random access memory (RAM), read-only memory (ROM), erasable programmable read-only memory (EPROM), or any other type of computer readable memory. The storage memory 114 may be volatile or non-volatile memory.

The back end module 112 may be a module that accesses the storage memory 114. The back end module 112 may include all or part of an implementation of one or more of the storage commands, such as the read command 102. The back end module 112 may include a common logic module 116, a parallel logic module 118, and an error correction module 120.

The parallel logic module 118 may be logic that is, at least in part, executable by multiple threads 122 in parallel. In contrast, the common logic module 116 may be logic that is, at least in part, single threaded. Single threaded logic may be executed by only one thread at a time. However, multiple threads may execute the single threaded logic, just not concurrently. The common logic module 116 may include or use one or more locking mechanisms to limit access to one thread at a time. Examples of the locking mechanism may include a mutex, a semaphore, and/or any other mechanism for limiting access to one thread at a time.

The threads 122 may be threads and/or processes. In some examples, each of the threads 122 may be a corresponding process. In other examples, each of the threads 122 may be part of one process. In still other examples, the threads 122 may include a combination of processes and threads.

The common logic module 116 may include a read module 124, an error detection module 126, a decision module 128, and a communication module 130. The common logic module 116 may include fewer, additional, or different components. For example, the parallel logic module 118 may include the read module 124 and/or the error detection module 126 instead of the common logic module 116.

The read module 124 may be any component that reads data 132 from the storage memory 114. The read module 124 may include any component that retrieves the data 132 from the storage memory 114. For example, the read module 124 may include a hardware controller such as a Direct Memory Access (DMA) controller, a memory controller, or a disk controller.

The error detection module 126 may be any component that detects an error in the data 132. For example, the error detection module 126 may include a part of Error Correction Code (ECC) that detects errors in the data 132 read from the storage memory 114. The ECC may detect an error based on a code generated from all or part of the data 132. Alternatively or in addition, the error detection module 126 may include logic that checks a parity bit. In still other examples, the error detection module 126 may include a component that detects any type of error in the data 132 or in a reading of the data 132 from the storage memory 112.

The error correction module 120 may be any component that corrects one or more errors in the data 132 read from the storage memory 114. In some examples, the error correction module 120 may include part of the ECC that corrects the error in the data 132 from the code generated from all or part of the data 132. Alternatively or in addition, the error correction module 120 may correct the error by re-reading the data 132 from the storage memory 114 and/or by any other mechanism.

The decision module 128 may be a component that determines whether to send placeholder data 134 to the host 104 in lieu of the data 132 when the error detection module 126 detects the error in the data 132. As discussed in more detail further below, the decision module 128 may make such a determination based on one or more criteria.

The communication module 130 may be any component that handles communication with the host 104 through the storage protocol module 110. For example, the communication module 130 may be a component that transmits the data 132 and/or the placeholder data 134 to the host 104. Transmission of information may mean initiating transmission of the information and/or actually transmitting the information. For example, when the communication module 130 transmits information, the communication module 130 may merely initiate transmission of data. A second component, such as the physical and data layers module 108 or a communications interface (not shown) may actually transmit the information to the host 104. Similarly, receiving information from the host 104 may mean receiving the information directly or indirectly from a second component that actually received the information from the host 104.

During operation of the system 100 to process the storage commands, the storage device 106 may receive the read command 102 from the host 104. The host 104 may have transmitted the read command 102 to the storage device in response to attempting to read a file or part of a file, for example.

The storage protocol module 110 may extract the command 102 from one or more packets, or other units of network data, which are processed by the physical and data layers module 108.

One or more of the threads 122 may execute logic included in the parallel logic module 118 and the common logic module 116 in order to complete the read command 102. The storage device 106 may be processing one or more storage commands in parallel with the read command 102. In some examples, one or more of the threads 122 attempting to execute logic in the common logic module 116 may become blocked, waiting for a thread that is already executing the logic in the common logic module 116. Once the thread completes execution of the logic in the common logic module 116 and/or otherwise releases the thread's lock on logic of the common logic module 116, then one of the blocked threads 122 may begin executing the logic in the common logic module 116. One or more entry points of the common logic module 116 may be considered a convergence point or a blocking point for the threads 122.

Decreasing an amount of time that the thread retains a lock on the logic of the common logic module 116 may decrease an amount of time that the blocked threads 122 remain blocked. As described in more detail below, the thread executing the logic of the common logic module 116 may release the lock on the logic of the common logic module 116 before executing, or before completing execution of, the error correction module 120 if an error is detected in the data 132.

The error in the data 132 may be detected in the parallel logic module 118 and/or the common logic module 116. For example, the error may be detected when one of the threads 122 executes the error detection module 126 in the parallel logic module 118. Alternatively or in addition, the error may be detected when one of the threads 122 executes the error detection module 126 in the common logic module 116. If the error is detected, then the thread may execute 140 the error correction module 120. The error detection module 126 may generate corrected data 142. The thread may then attempt to execute 138 logic of the common logic module 116 in order to transmit the corrected data 142 to the host 104. In alternative examples, the thread that executes the error detection module 126 may be different than the thread that executes the error correction module 120.

The thread that detects the error in the data 132 with the error detection module 126 may have a lock on the logic of the common logic module 116 at the time that the error is detected. The thread may release the lock prior to, coincident with, or during execution of the error correction module 120 in order to unblock one or more of the blocked threads 122 before the error correction module 120 generates the corrected data 142.

Prior to releasing the lock and the corrected data 142 being generated, the thread may transmit the placeholder data 124 to the host 104 through the communication module 130 without sending an indication that the read command 102 failed or succeeded. The thread may not transmit an indication that the read command 102 failed because the host may have to transmit a second read command in order to receive the data 132. On the other hand, the thread may not transmit an indication that the read command 102 succeeded because the host 104 may improperly treat the placeholder data 134 as the data 132 that is stored in the storage memory 114.

There may be another reason that the thread does not transmit an indication that the read command 102 failed or succeeded prior to releasing the lock and/or transmitting the corrected data 142. In some examples, at the time the placeholder data 124 is transmitted, the error detection module 126 may not have detected the error yet. In other words, the storage device 106, in addition to the host 104, may not know whether the placeholder data 134 is the correct data 132 when the placeholder data 134 is transmitted. Accordingly, error detection at the storage device 106, in addition to error correction at the storage device 106, may be performed asynchronously to transmission of placeholder data 134 from the storage device 106 to the host 104. The placeholder data 134 may be any data. For example, the placeholder data 134 may be the data 132 read from the storage memory 114 that includes the error detected by the error detection module 126. In other words, the placeholder data 134 may be uncorrected data. In another example, the placeholder data 134 may be a predetermined pattern of bits, such as all zeroes or all ones. In yet another example, the placeholder data 134 may be data in a buffer that was the last data transmitted to the host 104. In still another example, the placeholder data 134 may be the data 132 read from the storage memory 114 that does not include any error.

The corrected data 142 may be the data 132 without the error detected by the error detection module 126. The corrected data 142 may not necessarily be generated from the data with the error. For example, the corrected data 142 may be generated by re-reading the data 132 from the storage memory 114.

Once the host receives the corrected data 142, the host may overwrite the placeholder data 134 that was previously received and stored in a buffer of the host 104. The host 104 may not indicate an error occurred when twice receiving data identified by the identifier 144 before the read command 102 completes. The read command 102 may complete after both the placeholder data 134 and the corrected data 142 are transmitted to the host 104. Alternatively or in addition, the read command 102 may complete after the storage device 106 transmits an indication that the read command 102 was successful in response to the error detection module 128 of the storage device 106 determining, subsequent to the transmission of the placeholder data 134, that the placeholder data 134 does not contain an error.

Consider an example where the storage protocol is NVMe. NVMe includes a feature in which the storage commands may be executed in a different order than the order in which the commands were received from the host 104. NVMe also includes a feature in which blocks or chunks of data read in response to a read command may be returned in any order. An identifier 144 may be transmitted to the host 104 along with a block or chunk of data, such as the placeholder data 134 or the corrected data 142. The identifier 144 may identify the block or chunk of data. For example, the identifier 144 may be a block offset, a logical block address, or any other identifier. The identifier 144 may be specific to, or independent of, the storage protocol.

In one example, the read command 102 received by the storage protocol module 110 may include a request for 16 kilobytes of data, which may be stored across four pages in the storage memory 114, where each page is 4 kilobytes. The storage protocol module 110 may include an NVMe controller when the storage protocol in NVMe. The back end module 112 may read and decode, for example, a first page and a second page successfully. However, a third page of data may have an error that may take time to correct with a decoder 146 included in the error correction module 120. Execution of other storage commands may continue in parallel with the decoder 146 that is attempting to decode the third page of 4 kilobytes of data. Meanwhile, and in order not to block data flow inside of the NVMe controller, 4 kilobytes of data (the placeholder data 134) may be provided in a buffer (not shown) in the storage device 106 that is reserved for the third page of 4 kilobytes of data. The NVMe controller may transmit the placeholder data 134 and the identifier 144 to the host 104. The identifier 144 may identify the placeholder data 134 as the third page of the data requested by the read command 102. However, the NVMe controller may not transmit an indication that the command to read 16 kilobytes is complete, nor may the NVMe controller transmit an indication that the command to read the 16 kilobytes failed. The thread may release the lock on the logic of the common logic module 116 when the thread finishes transmitting the placeholder data 134 to the host.

The decoder 146 may apply soft decoding with a number of soft bits to the code word stored in the third page in the storage memory 114. Upon successful decoding into the corrected data 142, the NVMe controller may transmit the corrected data 142 to the host 104, which replaces the erroneous 4 kilobytes of the placeholder data 134 at the host 104. After, or concurrently with the transmission of the corrected data 142 for the third page of data, the storage protocol module 110 may transmit a completion signal or any type of indication to the host 104 that the read command 102 succeed. If the remaining fourth page of data has not yet been transmitted to the host 104 when the corrected data 142 for the third page data is transmitted, then the NVMe controller may wait to transmit the indication that the read command 102 is complete until after the remaining fourth page of data is transmitted to the host 104. Alternatively, if the attempt to decode the third page with the decoder 146 fails, then a failure signal or any type of indication that the read command 102 failed may be transmitted to the host 104 if no further attempts to successfully read the data 132 for the third page is to be attempted.

Regardless of whether the read command 102 ultimately fails or succeeds, execution of the error correction module 146 does not block the data flow inside the storage protocol module 110, and does not block communications with the host 104. Therefore, other storage commands may proceed in parallel with the decoder 146 as the decoder 146 attempts to decode the third page. The storage device 106 may not mislead the host 104 by indicating that the read command 102 failed or succeed upon the detection of the error in the data 132 that was first read from the storage memory 114. In addition, the storage device 106 may transmit the placeholder data 134 to the host 104 without indicating that the placeholder data 134 is incorrect data. Alternatively, the storage device 106 may transmit the placeholder data 134 to the host 104 with an indication that the placeholder data 134 is incorrect data but without transmitting an indication that the read command 102 failed or succeeded. The indication that the placeholder data 134 is incorrect data may be any indication that the placeholder data 134 is not the data 132 requested. However, the indication that the placeholder data 134 is incorrect does not further indicate that the read command 102 failed.

More generally, the system 100 may operate similarly in an example where any command has been partially completed—not just a read command. If the storage device 106 may execute commands out of order, then the storage device 106 may determine whether to (1) transmit partial data related to an uncompleted command to the host 104, (without an indication of success or failure), and continue execution of the uncompleted command in a background thread (without blocking other commands), or (2) discard the partially completed command, and transmit a failure indication to the host 104.

In some examples, the system 100 may always transmit the placeholder data 134 when the error is detected in the data 132 read from the storage memory 114. Alternatively, the system 100 may conditionally transmit the placeholder data 134 when the error is detected. For example, the decision module 128 may analyze a cost of a delay resulting from transmission of the placeholder data 134 for the partially completed read command 102 and from subsequent generation and transmission of the corrected data 142 versus a cost of incurring a delay that results from transmitting a failure indication to the host 104 and completely re-executing the read command 102. In one example, the decision module 128 may determine to transmit the placeholder data 134 when a cost of a delay that results from the transmission of the placeholder data 134 for the uncompleted read command 102 is lower than a cost of a delay resulting from transmission of an indication that the read command 102 failed and from a complete re-execution of the read command 102.

The cost of delay resulting from transmission of the placeholder data 134 and subsequent generation and transmission of the corrected data 142 may depend on an error rate of the storage memory 114. In an aging flash memory storage device, for example, the number of undecodable code words and/or the number of code words that require a longer decode time may increase with the age of the flash memory storage device. The longer decode time in the older flash memory storage device may result from a need to read additional soft bits and to perform longer decoding iterations in order to generate the corrected data 142. Accordingly, when a percentage of such code words with respect to a total number of code words read is below a threshold percentage, the decision module 128 may decide to transmit the placeholder data 134 to the host 104 and to continue to execute the decoder 146 in a background thread instead of completely re-executing the command. Alternatively, when the percentage of undecodable code words and/or code words that require long decode times increases beyond the threshold percentage, an indication that the read command 102 failed may be transmitted to the host 104 instead of the placeholder data 134.

The decision module 128 may base the decision of whether to transmit the placeholder data 134 instead of an indication that an error occurred in the execution of the read command 102 on any type of condition or conditions. For example, the decision module 128 may determine that the placeholder data 134 is to be transmitted when an age of the storage memory 114 is below a threshold value. For example, the decision module 128 may determine that the placeholder data 134 is to be transmitted when a cycle count of the storage memory 114 is below a threshold cycle count, but not when the cycle count of the storage memory 114 is above the threshold cycle count.

The system 100 may be implemented with additional, different, or fewer components. For example, the system 100 may include just the common logic module 116, the parallel logic module, and the error correction module 120.

Each component may include additional, different, or fewer components. For example, the common logic module 116 may include only the read module 124 and the communication module 130. In another example, storage device 106 may include a processor 148 and a memory 150

The processor 148 may be in communication with the memory 150. In one example, the processor 148 may also be in communication with additional components, such as the storage protocol module 110. Examples of the processor 148 may be a microcontroller, a general processor, central processing unit, an application specific integrated circuit (ASIC), a digital signal processor, a field programmable gate array (FPGA), a digital circuit, an analog circuit, or combinations thereof.

The processor 148 may be one or more devices operable to execute logic included in one or more modules, such as the parallel logic module 118, the common logic module 116 and/or the error correction module 120. The logic may include computer executable instructions or computer code embodied in the memory 150 or in other memory that when executed by the processor 148, cause the processor to perform the features of the corresponding module and/or modules. The computer code may include instructions executable with the processor 148.

The system 100 may be implemented in many different ways. Each module, such as the physical and data layers module 108, the storage protocol module 110, the back end module 112, the common logic module 116, the parallel logic module 118, the error correction module 120, the read module 124, the error detection module 126, the decision module 128, and/or the communication module 130, may be hardware or a combination of hardware and software. For example, each module may include an application specific integrated circuit (ASIC), a Field Programmable Gate Array (FPGA), a circuit, a digital logic circuit, an analog circuit, a combination of discrete circuits, gates, or any other type of hardware or combination thereof. Alternatively or in addition, each module may include memory hardware, such as a portion of the memory 150, for example, that comprises instructions executable with the processor 148 or other processor to implement one or more of the features of the module. When any one of the modules includes the portion of the memory that comprises instructions executable with the processor 148, the module may or may not include the processor 148. In some examples, a respective one of the modules may just be the portion of the memory 150 or other physical memory that comprises instructions executable with the processor 148 or other processor to implement the features of the respective module without the module including any other hardware. Because each module includes at least some hardware, even when the included hardware comprises software, each module may be interchangeably referred to as a hardware module, such as the read hardware module 124, the error detection hardware module 126, the communication hardware module 130 and the error correction hardware module 120.

Some features are described as stored in a computer readable storage medium (for example, as logic implemented as computer executable instructions or as data structures in the memory 150). Part of the system 100 and its logic and data structures may be stored on, distributed across, or read from one or more types of computer readable storage media. Examples of the computer readable storage medium may include a hard disk, a floppy disk, a CD-ROM, a flash drive, a cache, volatile memory, non-volatile memory, RAM, flash memory, or any other type of computer readable storage medium or storage media. The computer readable storage medium may include any type of non-transitory computer readable medium, such as a CD-ROM, a volatile memory, a non-volatile memory, Read Only Memory (ROM), Random Access Memory (RAM), or any other suitable storage device.

The processing capability of the system 100 may be distributed among multiple entities, such as among multiple processors and memories, optionally including multiple distributed processing systems. Parameters, databases, and other data structures may be separately stored and managed, may be incorporated into a single memory or database, may be logically and physically organized in many different ways, and may implemented with different types of data structures such as linked lists, hash tables, or implicit storage mechanisms. Logic, such as programs or circuitry, may be combined or split among multiple programs, distributed across several memories and processors, and may be implemented in a library.

Figure 2:
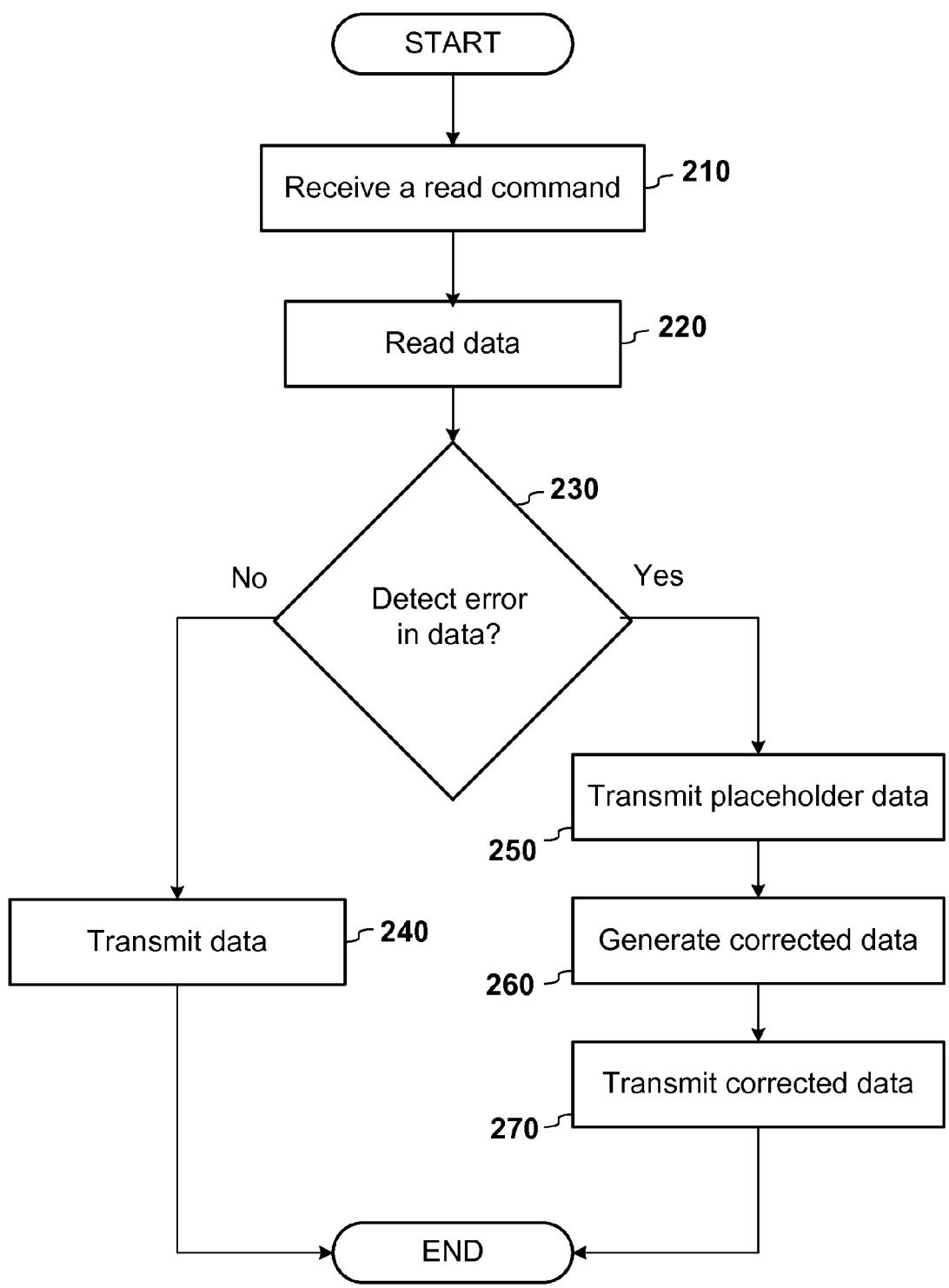
FIG. 2 illustrates a flow diagram of example logic of a system to process storage commands.

FIG. 2 illustrates a flow diagram of example logic of the system 100. Operations may begin when the read command 102 is received (210) at the storage device 106 from the host 104. The read command 102 may include a request for the data 132 identified by the identifier 144. The data 132 may be read (220) from the storage memory 114 at the storage device 106 based on the identifier 144.

A determination (230) may be made at the storage device 106 whether an error was detected in the data 132 read from the storage memory 114. If no error was detected, then the data 132 may be transmitted (240) to the host 104, and operations may end.

Alternatively, if an error was detected, then the placeholder data 134 may be transmitted (250) from the storage device 106 to the host 104 without transmitting an indication that the read command 102 failed or succeeded. When transmitted, the placeholder data 134 may be represented to the host 104 as the data 132 identified by the identifier 144.

The corrected data 142 may be generated (260) such that the corrected data 142 does not include the error detected in the data 132 read from the storage memory 114. The corrected data 142 may be transmitted (270) from the storage device 106 to the host 104, where the corrected data 142 replaces the placeholder data 134 in the host 104 as the data 132 identified by the identifier 144. The operations may then end.

Operations may end by, for example, by transmitting an indication that the read command 102 completed successfully to the host 104.

The logic illustrated in FIG. 2 may include additional, different, or fewer operations. The operations may be executed in a different order than illustrated in FIG. 2.

Figure 3:
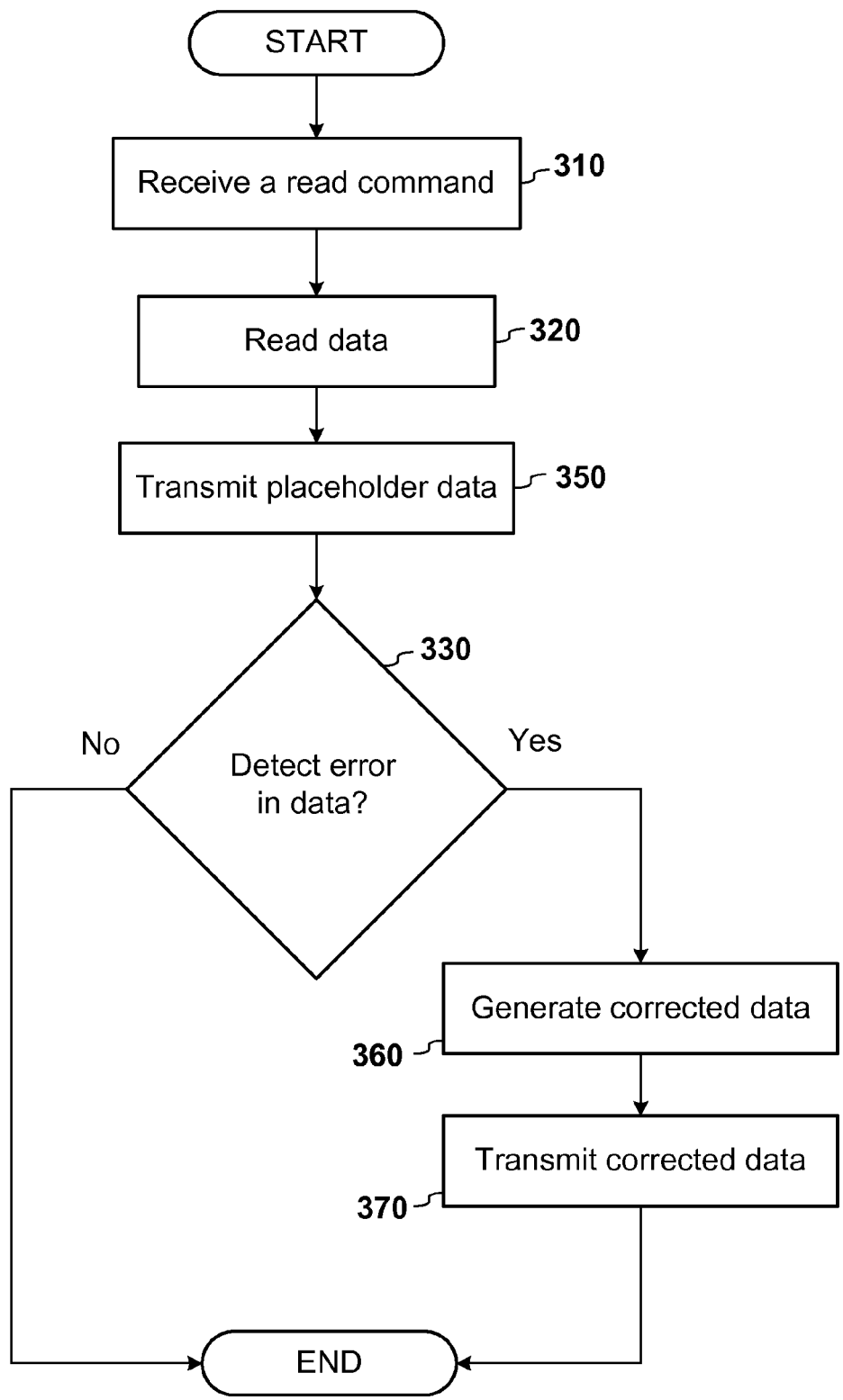
FIG. 3 illustrates a flow diagram of a second example of logic of a system to process storage command.

For example, FIG. 3 illustrates a flow diagram of example logic of the system 100 that differs from the logic illustrated in FIG. 2. Operations may begin when the read command 102 is received (310) at the storage device 106 from the host 104. The read command 102 may include a request for the data 132 identified by the identifier 144. The data 132 may be read (320) from the storage memory 114 at the storage device 106 based on the identifier 144.

The placeholder data 134 may be transmitted (350) from the storage device 106 to the host 104 without transmitting an indication that the read command 102 failed or succeeded. The placeholder data 134 may be the raw data read from the storage memory 114. The raw data may or may not include an error.

A determination (330) may be made at the storage device 106 whether an error is detected in the data 132 read from the storage memory 114. In one example, the determination (330) may be made in parallel with, or after, the transmission (350) of the placeholder data 134. If no error is detected, then the placeholder data 134, which included the correct data 132 requested by the read command 102, was already transmitted or is in the process of being transmitted. Accordingly, operations may end.

Alternatively, if an error is detected, then the corrected data 142 may be generated (360) such that the corrected data 142 does not include the error detected in the data 132 read from the storage memory 114. The corrected data 142 may be transmitted (370) from the storage device 106 to the host 104, where the corrected data 142 replaces the placeholder data 134 in the host 104 as the data 132 identified by the identifier 144. The operations may then end.

Operations may end by, for example, by transmitting an indication to the host 104 that the read command 102 completed successfully.

All of the discussion, regardless of the particular implementation described, is exemplary in nature, rather than limiting. For example, although selected aspects, features, or components of the implementations are depicted as being stored in memories, part of the system or systems may be stored on, distributed across, or read from other computer readable storage media, for example, secondary storage devices such as hard disks, flash memory drives, floppy disks, and CD-ROMs. Moreover, the various modules and screen display functionality is but one example of such functionality and any other configurations encompassing similar functionality are possible.

The respective logic, software or instructions for implementing the processes, methods and/or techniques discussed above may be provided on computer readable storage media. The functions, acts or tasks illustrated in the figures or described herein may be executed in response to one or more sets of logic or instructions stored in or on computer readable media. The functions, acts or tasks are independent of the particular type of instructions set, storage media, processor or processing strategy and may be performed by software, hardware, integrated circuits, firmware, micro code and the like, operating alone or in combination. Likewise, processing strategies may include multiprocessing, multitasking, parallel processing and the like. In one embodiment, the instructions are stored on a removable media device for reading by local or remote systems. In other embodiments, the logic or instructions are stored in a remote location for transfer through a computer network or over telephone lines. In yet other embodiments, the logic or instructions are stored within a given computer, central processing unit ("CPU"), graphics processing unit ("GPU"), or system.

Furthermore, although specific components are described above, methods, systems, and articles of manufacture described herein may include additional, fewer, or different components. For example, a processor may be implemented as a microprocessor, microcontroller, application specific integrated circuit (ASIC), discrete logic, or a combination of other type of circuits or logic. Similarly, memories may be DRAM, SRAM, Flash or any other type of memory. Flags, data, databases, tables, entities, and other data structures may be separately stored and managed, may be incorporated into a single memory or database, may be distributed, or may be logically and physically organized in many different ways. The components may operate independently or be part of a same program or apparatus. The components and/or devices may be resident on separate hardware, such as separate removable circuit boards, or share common hardware, such as a same memory and processor for implementing instructions from the memory. Programs may be parts of a single program, separate programs, or distributed across several memories and processors.

To clarify the use of and to hereby provide notice to the public, the phrases "at least one of <A>, <B>, . . . and <N>" or "at least one of <A>, <B>, . . . <N>, or combinations thereof" or "<A>, <B>, . . . and/or <N>" are defined by the Applicant in the broadest sense, superseding any other implied definitions hereinbefore or hereinafter unless expressly asserted by the Applicant to the contrary, to mean one or more elements selected from the group comprising A, B, . . . and N. In other words, the phrases mean any combination of one or more of the elements A, B, . . . or N including any one element alone or the one element in combination with one or more of the other elements which may also include, in combination, additional elements not listed.

While various embodiments have been described, it will be apparent to those of ordinary skill in the art that many more embodiments and implementations are possible. Accordingly, embodiments and implementations described herein shall not be considered to be the only possible embodiments and implementations.

What is claimed is:

1. A method of processing storage commands, the method comprising:
   receiving a first read command at a storage device from a host, the first read command comprising a request for data identified by an identifier of one or more logical data blocks;
   reading, at the storage device, data from storage memory based on the identifier;
   detecting, at the storage device, an error in the data read from the storage memory;
   transmitting placeholder data from the storage device to the host without transmitting an indication that the first read command failed or succeeded, the placeholder data indicated to the host as the data identified by the identifier;
   generating corrected data that does not include the error detected in the data read from the storage memory;
   transmitting the corrected data from the storage device to the host, wherein the corrected data replaces the placeholder data in the host as the data identified by the identifier; and
   reading data requested by a second read command from the storage memory in parallel with at least one of the generating the corrected data for the first read command or the transmitting the corrected data for the first read command, wherein the first and the second read commands conform to a storage protocol that provides logical block level access to the storage device.

2. The method of claim 1, wherein transmitting the placeholder data comprises transmitting the placeholder data without an indication that the placeholder data is incorrect.

3. The method of claim 1, wherein transmitting the placeholder data comprises transmitting the placeholder data after detection of the error in the data.

4. The method of claim 1, wherein the placeholder data comprises the data that includes the error.

5. The method of claim 1, wherein the placeholder data comprises a predetermined pattern.

6. The method of claim 1 further comprising transmitting an indication from the storage device to the host that the read command is complete after, or concurrently with, transmission of the corrected data.

7. A system for processing storage commands, the system comprising:
   a storage memory comprising data, wherein a first read command received from a host requests the data;
   a read module configured to read the data from the storage memory;
   an error detection module configured to detect an error in the data read from the storage memory;
   a communication module configured to transmit placeholder data to the host without an indication that the first read command failed or succeeded, wherein the placeholder data is represented to the host as the data requested by the first read command; and
   an error correction module configured to correct the error in the data read from the storage memory, wherein the communication module is further configured to transmit the corrected data to the host, wherein the corrected data is represented to the host as the data requested by the first read command, wherein the first read command completes upon transmission of the corrected data to the host, and wherein the read module is further configured to read data requested by a second read command from the storage memory in parallel with at least one of a correction of the error by the error correction module based on the first read command or a transmission of the corrected data by the communication module to the host based on the first read command.

8. The system of claim 7 further comprising a decision module configured to determine whether to transmit the placeholder data to the host based on a cost analysis.

9. The system of claim 8, wherein the decision module determines to transmit the placeholder data when a cost of a delay that results from a transmission of the placeholder data and from a generation of the corrected data is lower than a cost of a delay that results from transmission of an indication that the first read command failed and from a complete re-execution of the first read command.

10. The system of claim 8, wherein the decision module determines to transmit the placeholder data when an error rate of the storage memory is below a threshold error rate.

11. The system of claim 7, wherein the communication module is configured to transmit the placeholder data to the host without an indication that the placeholder data is not the data requested by the first read command.

12. The system of claim 7, wherein the read module includes a hardware controller.

13. The system of claim 7, wherein the first read command is a storage command that conforms to a storage protocol, and the storage protocol provides block level access to block devices.

14. A storage device that processes storage commands, the storage device comprising:
   a storage memory comprising data, wherein a first read command received from a host requests the data; and
   a processor configured to:
   read the data requested by the first read command from the storage memory;
   detect an error in the data after the data is read from the storage memory;
   cause placeholder data to be transmitted to the host without transmission of an indication that the first read command failed or succeeded, wherein the placeholder data is represented as the data requested by the first read command; and
   generate corrected data, wherein the processor is further configured to cause the corrected data to be transmitted to the host, the corrected data represented as the data requested by the first read command, wherein the corrected data and the placeholder data are transmitted in fulfillment of the first read command, and wherein the processor is configured to cause the placeholder data to be transmitted for the first read command, to generate the corrected data for the first read command, or both, in parallel with a read, by the processor, of data requested by a second read command.

15. The storage device of claim 14, wherein the processor is configured to determine, in response to detection of the error in the data, whether to transmit the placeholder data to the host or to transmit an indication that the first read command failed.

16. The storage device of claim 15, wherein the processor is configured to determine that the placeholder data is to be transmitted when an indication of an age of the storage memory is below a threshold value.

17. The storage device of claim 14, wherein generation of the correct data is executed by a thread that is different than a thread that transmits the placeholder data to the host.

18. The storage device of claim 14, wherein the processor is configured to transmit the placeholder data and the corrected data via a communication module comprising logic that is single threaded.

19. The storage device of claim 14, wherein the processor is configured to detect the error in the data in an error detection module that is single threaded and to generate the corrected data in a error correction module that is not single threaded.

20. The storage device of claim 14 further comprising a Direct Memory Access controller that reads the data from the storage memory.

* * * * *